(12) United States Patent
Kitamura et al.

(10) Patent No.: US 8,168,781 B2
(45) Date of Patent: May 1, 2012

(54) ORGANIC SEMICONDUCTING MATERIAL, AND FILM, ORGANIC ELECTRONIC DEVICE AND INFRARED DYE COMPOSITION EACH INCLUDING SAID MATERIAL

(75) Inventors: Tetsu Kitamura, Kanagawa (JP);
Masayuki Hayashi, Kanagawa (JP);
Kimiatsu Nomura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 20 days.

(21) Appl. No.: 12/195,756

(22) Filed: Aug. 21, 2008

(65) Prior Publication Data
US 2009/0054641 A1    Feb. 26, 2009

(30) Foreign Application Priority Data
Aug. 23, 2007   (JP) .................. 2007-216855

(51) Int. Cl.
*C07B 47/00*   (2006.01)
*C07D 487/22*  (2006.01)
(52) U.S. Cl. .................. 540/145; 106/31.46
(58) Field of Classification Search .................. 540/145; 106/31.46
See application file for complete search history.

(56) References Cited

U.S. PATENT DOCUMENTS

| | | | | |
|---|---|---|---|---|
| 4,886,721 A | * | 12/1989 | Hayashida et al. | ......... 430/58.55 |
| 5,021,563 A | * | 6/1991 | Hayashida et al. | ........... 540/128 |
| 5,034,309 A | | 7/1991 | Tai et al. | |
| 5,081,236 A | * | 1/1992 | Hayashida et al. | ........... 540/128 |
| 5,214,188 A | | 5/1993 | Tai et al. | |

FOREIGN PATENT DOCUMENTS

| | | | |
|---|---|---|---|
| JP | 63233886 | * | 9/1988 |
| JP | 02202482 | * | 8/1990 |
| JP | 03071889 | * | 3/1991 |
| JP | 2003-234460 A | | 8/2003 |
| JP | 2003-332551 A | | 11/2003 |
| JP | 2005-268609 A | | 9/2005 |

OTHER PUBLICATIONS

Nalwa et al., "Large Third-order Optical non-linearities . . .", J'nal of Porphyrins and Phthalocyanines, vol. 2, 21-30 (1998).*
Moyer et al., Polymer Preprints (ACS, Div. of Polymer Chem), 1984, 25(2), 234-5.*
Wen et al., Journal of the Chinese Chem. Soc. (Taipai), 1996), 43(2) pp. 123-132.*

* cited by examiner

*Primary Examiner* — Paul V. Ward
(74) *Attorney, Agent, or Firm* — Sughrue Mion, PLLC

(57) ABSTRACT

An organic semiconducting material comprises a naphthalocyanine derivative represented by formula (1);

Formula (1)

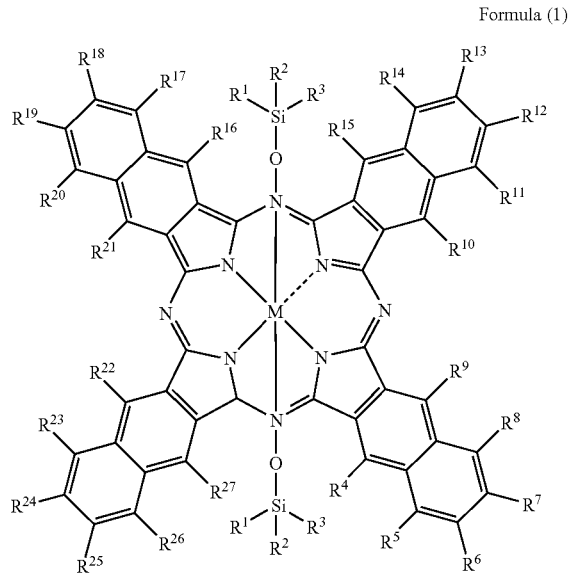

wherein M represents Si, Ge or Sn, $R^1$ to $R^3$ represent substituents other than a hydrogen atom except that all of $R^1$ to $R^3$ are identical straight-chain alkyl groups, and $R^4$ to $R^{27}$ each independently represents a hydrogen atom or a substituent.

4 Claims, 3 Drawing Sheets

ORGANIC SEMICONDUCTING MATERIAL, AND FILM, ORGANIC ELECTRONIC DEVICE AND INFRARED DYE COMPOSITION EACH INCLUDING SAID MATERIAL

This is a non-provisional application which claim priority from Japanese patent application No. 2007-216855 filed on Aug. 23, 2007, which is incorporated herein be reference.

BACKGROUND OF THE INVENTION

1. Field of the Invention

The present invention relates to an organic semiconducting material including a naphthalocyanine derivative of a specific structure, a film containing such an organic semiconducting material, and organic electronic devices, especially an organic photoelectric transducer and an organic transistor, and an infrared dye composition which each use such an organic semiconducting material.

2. Description of the Related Art

Devices using organic semiconducting materials can be manufactured by simple processes as compared with traditional devices using inorganic semiconducting materials including silicon and the like. In addition, organic semiconducting materials can have their variations in plenty because their material characteristics can be altered easily by modification of their molecular structures. Therefore, it is conceivable that organic semiconducting materials will allow realization of such functions and devices as have never been achieved by inorganic semiconducting materials, and recent years have seen extensive studies of devices using organic semiconducting materials. Examples of a device using an organic semiconducting material include photoelectric transducers using organic semiconducting materials as photoelectric conversion materials, such as organic thin-film solar cells and solid-state image pickup devices, and organic transistors (*Shinkasuru Yuki Handotai*, NTS Inc. (2006)).

The use of organic semiconducting materials allowing film formation by a solution process makes it possible to manufacture large-area devices at low cost under low temperatures as compared with devices manufactured using inorganic semiconducting materials including silicon and the like. As an example of research on organic thin-film solar cells taking advantage of such a property, the case is proposed where the mixed film including a polythiophene derivative P3HT (poly (3-hexylthiophene)) and a fullerene derivative PCBM ([6,6]-phenyl-$C_{61}$-butyric acid methyl ester) is formed by a solution process and used as a photoelectric conversion layer. However, this case can not match silicon-utilized solar cells in photoelectric conversion capability, so further improvement in performance is required thereof. A cause of low energy conversion efficiency of organic thin-film solar cells consists in that the organic materials used therein show light absorption and photoelectric conversion in wavelength regions narrower than the wavelength region of the light radiating from the sun, and that they fail to utilize light in long wavelength region (infrared region) in particular (Kaku Uehara & Susumu Yoshikawa (editors), *Yuki Hakumaku Taiyo Denchi no Saishin Gijutu* (Leading-edge Technology for Thin Film Organic Photovoltaic Cells), pp. 1-8, CMC Publishing Co., Ltd. (2005)). Therefore, it is desired to develop organic photoelectric conversion materials which can be formed into film by use of a solution process and have sensitivity in the infrared region.

In the field of solid-state image pickup devices, on the other hand, a silicon-utilized image pickup device has low sensitivity in the infrared region and the inorganic semiconducting material used therein, such as silicon, absorbs all the light in the wavelength region shorter than the wavelength region corresponding to an energy quantity of the band gap. Therefore, it is impossible to subject only the infrared light to photoelectric conversion. By contrast, an organic semiconducting material allows photoelectric conversion of only the light in a specific wavelength region, and there is disclosure of the visible-light solid-state image pickup devices of multilayer structure which take advantage of such a property (JP-A-2003-234460, JP-A-2003-332551 and JP-A-2005-268609). If a photoelectric conversion film allowing photoelectric conversion of only the infrared light can be obtained as in the above cases, it is conceivable that sampling of visible light information and infrared light information at the same time and the same point becomes possible by laminating such a photoelectric conversion film and a visible-light solid-state image pickup device; as a result, a high-performance multifunctional device allowing image information synthesis and easy processing can be obtained. In uses of solid-state image pickup devices, requirements for device performance including an S/N ratio and so on are much higher than those for expansion of area and a low cost process. So, film formation by a vacuum process is preferable, because the film formed by vacuum process resists contamination with impurities and easily takes on a multilayer structure in combination with other functional films. Under these circumstances, it is also desired to develop organic photoelectric conversion materials which can be made into film by a vacuum process and have sensitivity to only infrared light.

Many of materials known as infrared dyes suffer decomposition by heating, and only limited number of infrared dyes can be formed into film by a vacuum process. As an example of infrared dyes allowing film formation by a vacuum process, though bistrihexylsiloxylsilicon naphthalocyanine is known, its intermolecular interaction in the solid film is too weak for using the compound as an organic semiconducting material, so further improvement in carrier transporting ability is required (Journal of the American Chemical Society, 106, 7404-7414 (1984) and JP-A-63-5093).

SUMMARY OF THE INVENTION

The invention is made in view of the technical background mentioned above, and aims to provide a high-performance organic semiconducting material that can be formed into film by both a vacuum process and a solution process, has high stability and shows light absorption and photoelectric conversion characteristics in the infrared region, and further to provide a variety of high-performance organic electronic devices (especially a photoelectric transducer and an organic transistor) each using such an organic semiconducting material.

The objects of the invention are solved by the following aspects.

(1) An organic semiconducting material comprising a naphthalocyanine derivative represented by formula (1);

Formula (1)

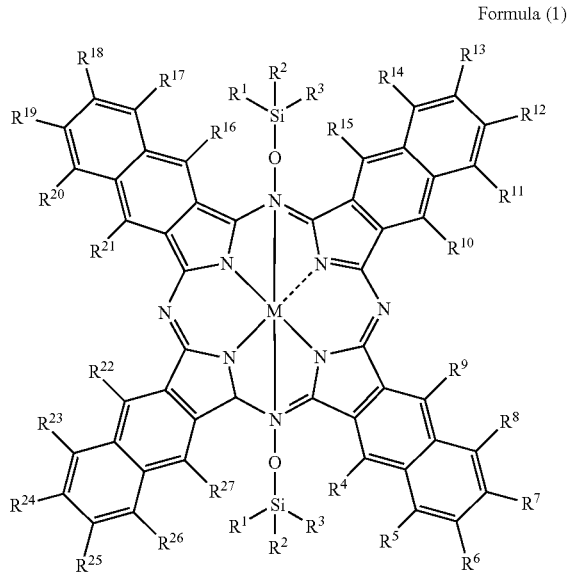

wherein M represents Si, Ge or Sn, $R^1$ to $R^3$ represent substituents other than a hydrogen atom except that all of $R^1$ to $R^3$ are identical straight-chain alkyl groups, and $R^4$ to $R^{27}$ each independently represents a hydrogen atom or a substituent.

(2) The organic semiconducting material according to (1), wherein at least one of the substituents $R^1$ to $R^3$ in the formula (1) is a branched alkyl group, an alkoxy group, an aromatic hydrocarbon group or an aromatic heterocyclic group.

(3) The organic semiconducting material according to (1) or (2), wherein the three substituents $R^1$ to $R^3$ in the formula (1) are selected from at least two different kinds of substituents.

(4) The organic semiconducting material according to any of (1) to (3), wherein M in the formula (1) is Si.

(5) The organic semiconducting material according to any of (1) to (4), wherein all of $R^4$ to $R^{27}$ in the formula (1) are hydrogen atoms.

(6) A film, containing at least one of the organic semiconducting materials according to any of (1) to (5).

(7) The film according to (6), which is formed by a vacuum evaporation method.

(8) The film according to (6), which is formed by a solution coating method.

(9) An organic electronic device comprising the organic semiconducting material according to any of (1) to (5).

(10) The organic electronic device according to (9), which is an organic transistor.

(11) The organic electronic device according to (9), which is an organic photoelectric transducer.

(12) An infrared dye composition comprising a naphthalocyanine derivative represented by formula (1);

Formula (1)

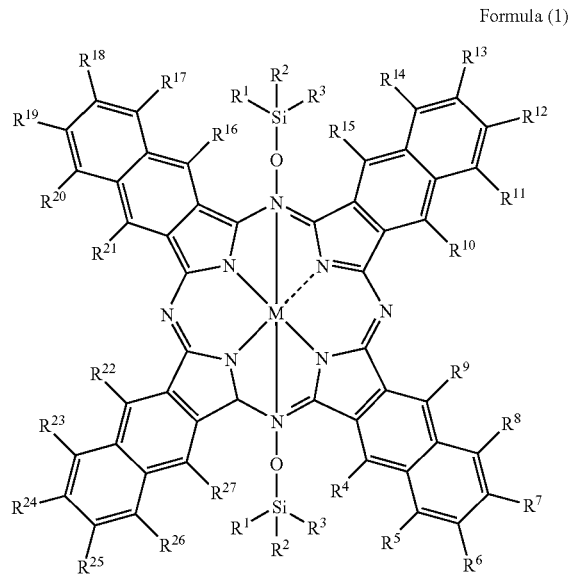

wherein M represents Si, Ge or Sn, $R^1$ to $R^3$ represent substituents other than a hydrogen atom except that all of $R^1$ to $R^3$ are identical straight-chain alkyl groups, and $R^4$ to $R^{27}$ each independently represents a hydrogen atom or a substituent.

BRIEF DESCRIPTION OF THE DRAWINGS

FIGS. 4A and 4B are graphs showing the FET characteristics of Compound 4 according to the invention, in which FIG. 4A shows drain voltage-drain current characteristic, and FIG. 4B shows gate voltage-drain voltage under 100V application-drain current characteristic).

DETAILED DESCRIPTION OF THE INVENTION

Figure 1:
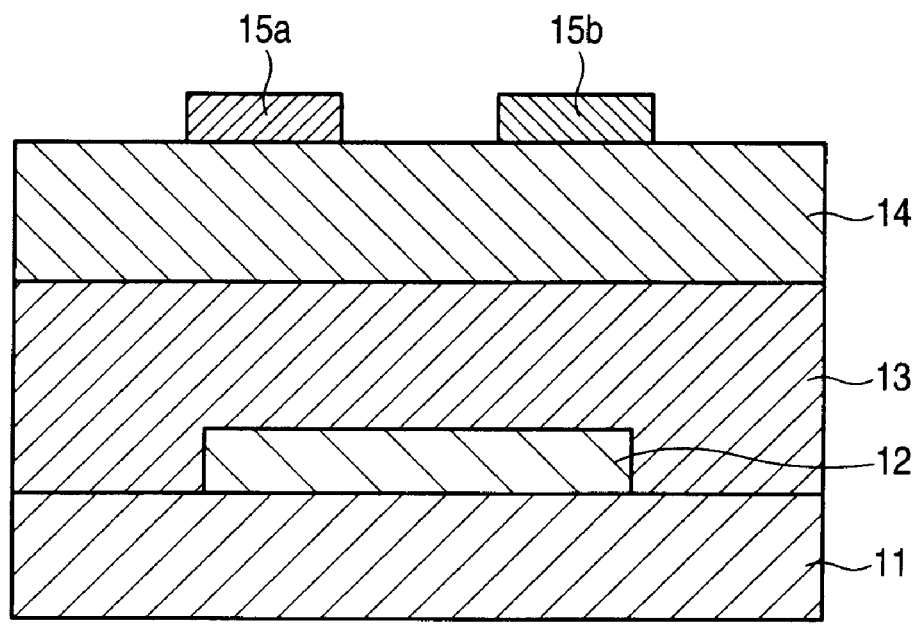
FIG. 1 is a cross-sectional diagram schematically showing the structure of an organic field-effect transistor device according to the invention.

The invention is described below in detail.
The naphthalocyanine derivatives represented by the following formula (1) are illustrated.

Formula (1)

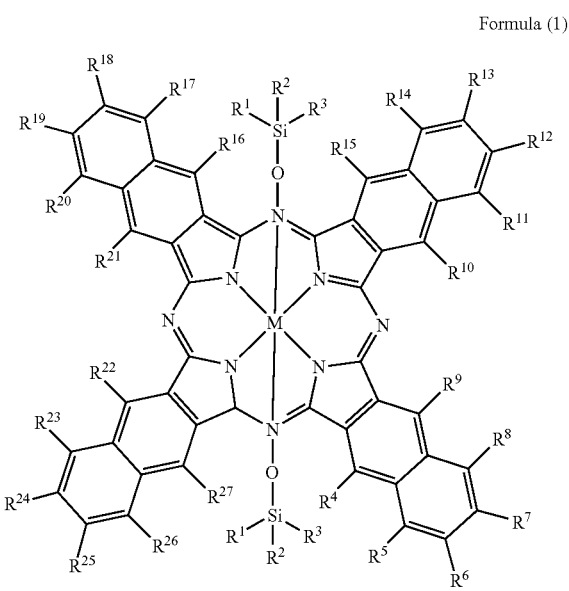

$R^1$ to $R^3$ represent substituents other than a hydrogen atom, and $R^4$ to $R^{27}$ represent hydrogen atoms or substituents. Herein, the substituents may be any substituents, with examples including atoms and groups enumerated below as Substituent W.

Examples of the Substituent W include a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a heterocyclic group (which may be referred to as a hetero ring group), a cyano group, a hydroxyl group, a nitro group, a carboxyl group, an alkoxyl group, an aryloxy group, a silyloxy group, a heterocyclyloxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl- or arylsulfonylamino group, a mercapto group, an alkylthio group, an arylthio group, a heterocyclylthio group, a sulfamoyl group, a sulfo group, an alkyl- or arylsulfinyl group, an alkyl- or arylsulfonyl group, an acyl group, an aryloxycarbonyl group, an alkoxycarbonyl group, a carbamoyl group, an aryl- or heterocyclylazo group, an imido group, a phosphino group, a phosphinyl group, a phosphinyloxy group, a phosphinylamino group, a phosphono group, a silyl group, a hydrazino group, an ureido group, a boronic acid group (—B(OH)$_2$), a phosphate group (—OPO(OH)$_2$), a sulfato group (—OSO$_3$H), and other known substituents.

In more detail, the Substituent W represents any of the following (1) to (48).

(1) Halogen Atom

Examples of the halogen atom include a fluorine atom, a chlorine atom, a bromine atom and an iodine atom.

(2) Alkyl Group

The alkyl group represents a straight-chain, branched or cyclic substituted or unsubstituted alkyl group, and includes the following (2-a) to (2-e) and so on.

(2-a) Alkyl Group

Alkyl groups containing 1 to 30 carbon atoms (e.g., methyl, ethyl, n-propyl, isopropyl, t-butyl, n-octyl, eicosyl, 2-chloroethyl, 2-cyanoethyl, 2-ethylhexyl) are preferred.

(2-b) Cycloalkyl Group

Substituted or unsubstituted cycloalkyl groups containing 3 to 30 carbon atoms (e.g., cyclohexyl, cyclopentyl, 4-n-dodecylcyclohexyl) are preferred.

(2-c) Bicycloalkyl Group

Substituted or unsubstituted bicycloalkyl groups containing 5 to 30 carbon atoms (e.g., bicyclo[1.2.2]heptane-2-yl, bicyclo[2.2.2]octane-3-yl) are preferred.

(2-d) Tricycloalkyl Group

Substituted or unsubstituted tricycloalkyl groups containing 7 to 30 carbon atoms (e.g., 1-adamantyl) are preferred.

(2-e) Polycyclic Alkyl Group Having More than Three Rings in its Structure

Incidentally, the alkyl moieties in substituent groups mentioned below (e.g., the alkyl moiety in an alkylthio group) are conceptual equivalent to the alkyl groups as recited above, but more closely defined, alkenyl and alkynyl groups are further included therein.

(3) Alkenyl Group

The alkenyl group represents a straight-chain, branched or cyclic substituted or unsubstituted alkenyl group. And these groups include (3-a) to (3-c).

(3-a) Alkenyl Group

Substituted or unsubstituted alkenyl groups containing 2 to 30 carbon atoms (e.g., vinyl, allyl, pulenyl, geranyl, oleyl) are preferred.

(3-b) Cycloalkenyl Group

Substituted or unsubstituted cycloalkenyl groups containing 3 to 30 carbon atoms (e.g., 2-cyclopentene-1-yl, 2-cyclohexene-1-yl) are preferred.

(3-c) Bicycloalkenyl Group

Substituted or unsubstituted bicycloalkenyl groups containing 5 to 30 carbon atoms (e.g., bicyclo[2.2.1]hepto-2-ene-1-yl, bicyclo[2.2.2]octo-2-ene-4-yl) are preferred.

(4) Alkynyl Group

Substituted or unsubstituted alkynyl groups containing 2 to 30 carbon atoms (e.g., ethynyl, propargyl, trimethylsilylethynyl) are preferred.

(5) Aryl Group

Substituted or unsubstituted aryl groups containing 6 to 30 carbon atoms (e.g., phenyl, p-tolyl, naphthyl, m-chlorophenyl, o-hexadecanoylaminophenyl, ferrocenyl) are preferred.

(6) Heterocyclic Group

The heterocyclic group is preferably a monovalent group formed by removing one hydrogen atom from a 5- or 6-membered, substituted or unsubstituted, aromatic or non-aromatic heterocyclic compound, and far preferably a 5- or 6-membered aromatic heterocyclic group containing 3 to 50 carbon atoms.

(Examples of such a heterocyclic group include 2-furyl, 2-thienyl, 2-pyrimidinyl and 2-benzothiazolyl groups. In addition, cationic heterocyclic groups, such as 1-methyl-2-pyridinio and 1-methyl-2-quinolinio groups, may be included therein.)

(7) Cyano Group
(8) Hydroxyl Group
(9) Nitro Group
(10) Carboxyl Group
(11) Alkoxyl Group Substituted or unsubstituted alkoxyl groups containing 1 to 30 carbon atoms (e.g., methoxy, ethoxy, isopropoxy, t-butoxy, n-octyloxy, 2-methoxyethoxy) are preferred.

(12) Aryloxy Group

Substituted or unsubstituted aryloxy groups containing 6 to 30 carbon atoms (e.g., phenoxy, 2-methylphenoxy, 4-t-butylphenoxy, 3-nitrophenoxy, 2-tetradecanoylaminophenoxy) are preferred.

(13) Silyloxy Group

Silyloxy groups containing 3 to 20 carbon atoms (e.g., trimethylsilyloxy, t-butyldimethylsilyloxy) are preferred.

(14) Heterocyclyloxy Group

Substituted or unsubstituted heterocyclyloxy groups containing 2 to 30 carbon atoms (e.g., 1-phenyltetrazolyl-5-oxy, 2-tetrahydropyranyloxy) are preferred.

(15) Acyloxy Group

A formyloxy group, substituted or unsubstituted alkylcarbonyloxy groups containing 2 to 30 carbon atoms and substituted or unsubstituted arylcarbonyloxy groups containing 6 to 30 carbon atoms (e.g., formyloxy, acetyloxy, pivaloyloxy, stearoyloxy, benzoyloxy, p-methoxyphenylcarbonyloxy) are preferred.

(16) Carbamoyloxy Group

Substituted or unsubstituted carbamoyloxy groups containing 1 to 30 carbon atoms (e.g., N,N-dimethylcarbamoyloxy, N,N-diethylcarbamoyloxy, morpholinocarbonyloxy, N,N-di-n-octylaminocarboxyloxy, N-n-octylcarbamoyloxy) are preferred.

(17) Akoxycarbonyloxy Group

Substituted or unsubstituted alkoxycarbonyloxy groups containing 2 to 30 carbon atoms (e.g., methoxycarbonyloxy, ethoxycarbonyloxy, t-butoxycarbonyloxy, n-octylcarbonyloxy) are preferred.

(18) Aryloxycarbonyloxy Group

Substituted or unsubstituted aryloxycarbonyloxy groups containing 7 to 30 carbon atoms (e.g., phenoxycaronyloxy, p-methoxyphenoxycarbonyloxy, p-n-hexadecyloxyphenoxycarbonyloxy) are preferred.

(19) Amino Group

An amino group, substituted or unsubstituted alkylamino groups containing 1 to 30 carbon atoms and substituted or unsubstituted anilino groups containing 6 to 30 carbon atoms (e.g., amino, methylamino, dimethylamino, anilino, N-methylanilino, diphenylamino) are preferred.

(20) Ammonio Group

An ammonio group, and ammonio groups substituted by substituted or unsubstituted alkyl, aryl or/and heterocyclic groups containing 1 to 30 carbon atoms (e.g., trimethylammonio, triethylammonio, diphenylmethylammonio) are preferred.

(21) Acylamino Group

A formylamino group, substituted or unsubstituted alkylcarbonylamino groups containing 1 to 30 carbon atoms and substituted or unsubstituted arylcarbonylamino groups containing 6 to 30 carbon atoms (e.g., formylamino, acetylamino, pivaloylamino, lauroylamino, benzoylamino, 3,4,5-tri-n-octyloxyphenylcarbonylamino) are preferred.

(22) Aminocarbonylamino Group

Substituted or unsubstituted aminocarbonylamino groups containing 1 to 30 carbon atoms (e.g., carbamoylamino, N,N-dimethylaminocarbonylamino, N,N-diethylaminocarbonylamino, morpholinocarbonylamino) are preferred.

(23) Alkoxycarbonylamino Group

Substituted or unsubstituted alkoxycarbonylamino group containing 2 to 30 carbon atoms (e.g., methoxycarbonylamino, ethoxycarbonylamino, t-butoxycarbonylamino, n-octadecyloxycarbonylamino, N-methylmethoxycarbonylamino) are preferred.

(24) Aryloxycarbonylamino Group

Substituted or unsubstituted aryloxycarbonylamino groups containing 7 to 30 carbon atoms (e.g., phenoxycarbonylamino, p-chlorophenoxycarbonylamino, m-n-octyloxyphenoxycarbonylamino) are preferred.

(25) Sulfamoylamino Group

Substituted or unsubstituted sulfamoylamino groups containing 0 to 30 carbon atoms (e.g., sulfamoylamino, N,N-dimethylaminosulfonylamino, N-n-octylaminosulfonylamino) are preferred.

(26) Alkyl- or arylsulfonylamino Group

Substituted or unsubstituted alkylsulfonylamino groups containing 1 to 30 carbon atoms and substituted or unsubstituted arylsulfonylamino groups containing 6 to 30 carbon atoms (e.g., methylsulfonylamino, butylsulfonylamino, phenylsulfonylamino, 2,3,5-trichlorophenylsulfonylamino, p-methylphenylsulfonylamino) are preferred.

(27) Mercapto Group

(28) Alkylthio Group

Substituted or unsubstituted alkylthio groups containing 1 to 30 carbon atoms (e.g., methylthio, ethylthio, n-hexadecylthio) are preferred.

(29) Arylthio Group

Substituted or unsubstituted arylthio groups containing 6 to 30 carbon atoms (e.g., phenylthio, p-chlorophenylthio, m-methoxyphenylthio) are preferred.

(30) Heterocyclylthio Group

Substituted or unsubstituted heterocyclylthio groups containing 2 to 30 carbon atoms (e.g., 2-benzothiazolylthio, 1-phenyltetrazole-5-ylthio) are preferred.

(31) Sulfamoyl Group

Substituted or unsubstituted sulfamoyl groups containing 0 to 30 carbon atoms (e.g., N-ethylsulfamoyl, N-(3-dodecyloxypropyl)sulfamoyl, N,N-dimethylsulfamoyl, N-acetylsulfamoyl, N-benzoylsulfamoyl, N—(N'-phenylcarbamoyl)sulfamoyl) are preferred.

(32) Sulfo Group

(33) Alkyl- or arylsulfinyl Group

Substituted or unsubstituted alkylsulfinyl groups containing 1 to 30 carbon atoms and substituted or unsubstituted arylsulfinyl groups containing 6 to 30 carbon atoms (e.g., methylsulfinyl, ethylsulfinyl, phenylsulfinyl, p-methylphenylsulfinyl) are preferred.

(34) Alkyl- or arylsulfonyl Group

Substituted or unsubstituted alkylsulfonyl groups containing 1 to 30 carbon atoms and substituted or unsubstituted arylsulfonyl groups containing 6 to 30 carbon atoms (e.g., methylsulfonyl, ethylsulfonyl, phenylsulfonyl, p-methylphenylsulfonyl) are preferred.

(35) Acyl Group

A formyl group, substituted or unsubstituted alkylcarbonyl groups containing 2 to 30 carbon atoms, substituted or unsubstituted arylcarbonyl groups containing 7 to 30 carbon atoms and substituted or unsubstituted heterocyclylcarbonyl groups containing 4 to 30 carbon atoms wherein each carbonyl group is attached to a carbon atom as the ring constituent (e.g., acetyl, pivaloyl, 2-chloroacetyl, stearoyl, benzoyl, p-n-octyloxyphenylcarbonyl, 2-pyridylcarbonyl, 2-furylcarbonyl) are preferred.

(36) Aryloxycarbonyl Group

Substituted or unsubstituted aryloxycarbonyl groups containing 7 to 30 carbon atoms (e.g., phenoxycarbonyl, o-chlorophenoxycarbonyl, m-nitrophenoxycarbonyl, p-t-butylphenoxycarbonyl) are preferred.

(37) Alkoxycarbonyl Group

Substituted or unsubstituted alkoxycarbonyl groups containing 2 to 30 carbon atoms (e.g., methoxycarbonyl, ethoxycarbonyl, t-butoxycarbonyl, n-octadecyloxycarbonyl) are preferred.

(38) Carbamoyl Group

Substituted or unsubstituted carbamoyl groups containing 1 to 30 carbon atoms (e.g., carbamoyl, N-methylcarbamoyl, N,N-dimethylcarbamoyl, N,N-di-n-octylcarbamoyl, N-(methylsulfonyl)carbamoyl) are preferred.

(39) Arylazo and Heterocyclylazo Groups

Substituted or unsubstituted arylazo groups containing 6 to 30 carbon atoms and substituted or unsubstituted heterocyclylazo groups containing 3 to 30 carbon atoms (e.g., phenylazo, p-chlorophenylazo, 5-ethylthio-1,3,4-thiadiazole-2-ylazo) are preferred.

(40) Imido Group

N-succinimido and N-phthalimido groups are preferred.

(41) Phosphino Group

Substituted or unsubstituted phosphino groups containing 2 to 30 carbon atoms (e.g., dimethylphosphino, diphenylphosphino, methylphenoxyphosphino) are preferred.

(42) Phosphinyl Group

Substituted or unsubstituted phosphinyl groups containing 2 to 30 carbon atoms (e.g., phosphinyl, dioctyloxyphosphinyl, diethoxyphosphinyl) are preferred.

(43) Phosphinyloxy Group

Substituted or unsubstituted phosphinyloxy groups containing 2 to 30 carbon atoms (e.g., diphenoxyphosphinyloxy, dioctyloxyphosphinyloxy) are preferred.

(44) Phosphinylamino Group

Substituted or unsubstituted phosphinylamino groups containing 2 to 30 carbon atoms (e.g., dimethoxyphosphinylamino, dimethylaminophosphinylamino) are preferred.

(45) Phospho Group

(46) Silyl Group

Substituted or unsubstituted Silyl groups containing 3 to 30 carbon atoms (e.g., trimethylsilyl, triethylsilyl, triisopropylsilyl, t-butyldimethylsilyl, phenyldimethylsilyl) are preferred.

(47) Hydrazino Group

Substituted or unsubstituted hydrazino groups containing 0 to 30 carbon atoms (e.g., trimethylhydrazino) are preferred.

(48) Ureido Group

Substituted or unsubstituted ureido groups containing 0 to 30 carbon atoms (e.g., N,N-dimethylureido) are preferred.

In addition, two Ws can form a ring in concert with each other. The ring formed may be an aromatic or non-aromatic hydrocarbon or heterocyclic ring, or a condensed polycyclic ring formed by further combining those rings. Examples of the ring formed include a benzene ring, a naphthalene ring, an anthracene ring, phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole, a phenanthridine ring, an acridine ring, a phenanthroline ring, a thianthrene ring, a chromene ring, a xanthene ring, a phenoxazine ring, a phenothiazine ring and a phenazine ring.

Of the groups recited as examples of the Substituent W, the groups having hydrogen atoms may be stripped of any of their individual hydrogen atoms and have any of the groups recited above as substituents for the hydrogen atoms. Examples of such a substituent include —$CONHSO_2$— group (a sulfonylcarbamoyl group or a carbonylsulfamoyl group), —CONHCO— group (a carbonylcarbamoyl group) and —$SO_2NHSO_2$— group (a sulfonylsulfamoyl group). More specifically, such substituents include alkylcarbonylaminosulfonyl groups (e.g., acetylaminosulfonyl), arylcarbonylaminosulfonyl groups (e.g., benzoylaminosulfonyl group), alkylsulfonylaminocarbonyl groups (e.g., methylsulfonylaminocarbonyl), and arylsulfonylaminocarbonyl groups (e.g., p-methylphenylsulfonylaminocarbonyl).

The case where 8 or more of $R^4$ to $R^{27}$ are hydrogen atoms is preferred, the case where 16 or more of $R^4$ to $R^{27}$ are hydrogen atoms is far preferred, and the case where all of $R^4$ to $R^{27}$ are hydrogen atoms is especially preferred. The substituents as $R^4$ to $R^{27}$ are preferably chosen from straight-chain or branched alkyl groups containing 1 to 6 carbon atoms, far preferably chosen from a methyl group, an ethyl group, an n-propyl group, an i-propyl group, an n-butyl group or a t-butyl group. Two or more of $R^4$ to $R^{27}$ may form a ring in concert with one another. Among them, the case where benzene rings are formed by combining $R^6$ with $R^7$, $R^{12}$ with $R^{13}$, $R^{18}$ with $R^{19}$, and $R^{24}$ with $R^{25}$ is preferred.

In the invention, it is preferred that the naphthalocyanine derivatives represented by formula (1) have satisfactory suitability for both vacuum process and solution process while maintaining properties as organic semiconductors. For imparting satisfactory vacuum process suitability to the derivatives, it is important that their structures are designed to resist thermal decomposition and to allow easy vaporization through the minimization of molecular weight and the moderate weakening of intermolecular interaction. And in imparting satisfactory solution process suitability to the derivatives, it is effective to moderately weaken the intermolecular interaction, to introduce hetero atoms, such as O, S or/and N, and so on.

From these points of view, it is appropriate that at least one of $R^1$ to $R^3$ be a branched alkyl group, preferably a branched alkyl group containing 3 to 6 carbon atoms, far preferably an i-propyl group, an i-butyl group, an s-butyl group or a t-butyl group. Alternatively, it is also appropriate that at least one of $R^1$ to $R^3$ be an alkoxyl group, preferably an alkoxyl group containing 1 to 6 carbon atoms, far preferably a methoxy group, an ethoxy group, an n-propoxy group, an i-propoxy group, an n-butoxy group or a t-butoxy group. Further, it is also appropriate that at least one of $R^1$ to $R^3$ be an aromatic hydrocarbon group or an aromatic heterocyclic group, preferably an aromatic hydrocarbon or heterocyclic group containing 2 to 12 carbon atoms, far preferably a phenyl group, a naphthyl group, a pyridyl group, a quinolinyl group or a thiophenyl group, particularly preferably a substituted or unsubstituted phenyl group. Furthermore, it is also appropriate that $R^1$ to $R^3$ be chosen from at least two different kinds of substituents. In this case, though at least the two different kinds of substituents may be any substituents, it is preferable that at least one of them is either a straight-chain or branched alkyl group (containing preferably 1 to 8 carbon atoms, far preferably 1 to 4 carbon atoms), or an alkoxy group (containing preferably 1 to 8 carbon atoms, far preferably 1 to 4 carbon atoms), or an aromatic hydrocarbon or heterocyclic group (containing preferably 2 to 12 carbon atoms, far preferably 2 to 10 carbon atoms), it is far preferable that at least two of them is chosen from those groups, and it is particularly preferable that all of the three are chosen from those groups.

As to the central metal M, the case where M is Si is especially suitable.

Examples of the compound according to the invention are illustrated below, but the invention should not be construed as being limited to these examples.

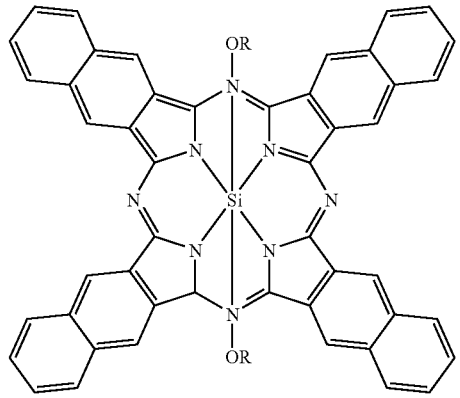

| Compounds 1 to 15 | |
| --- | --- |
| | R |
| Compound 1 | Si(i-Pr)$_3$ |
| Compound 2 | Si(i-Bu)$_3$ |
| Compound 3 | SiPh$_3$ |
| Compound 4 | Si(OEt)$_3$ |
| Compound 5 | Si(Ot-Bu)$_3$ |
| Compound 6 | 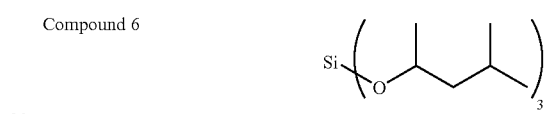 |
| Compound 7 | Si(NMe$_2$)$_3$ |
| Compound 8 | |
| Compound 9 | |
| Compound 10 | i-Pr<br>\|<br>Si—n-C$_8$H$_{17}$<br>\|<br>i-Pr |
| Compound 11 | |
| Compound 12 | |
| Compound 13 | |
| Compound 14 | Si—(CH$_2$)$_3$CN |

-continued
Compounds 1 to 15
| Compound 15 | |
|---|---|
| 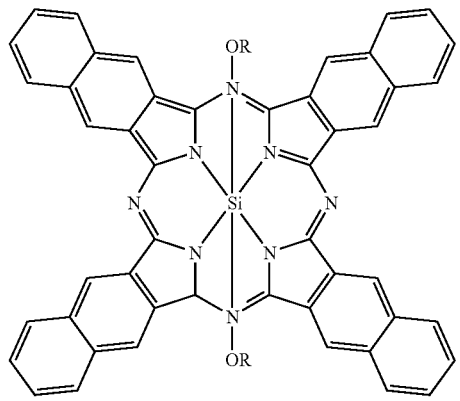 | 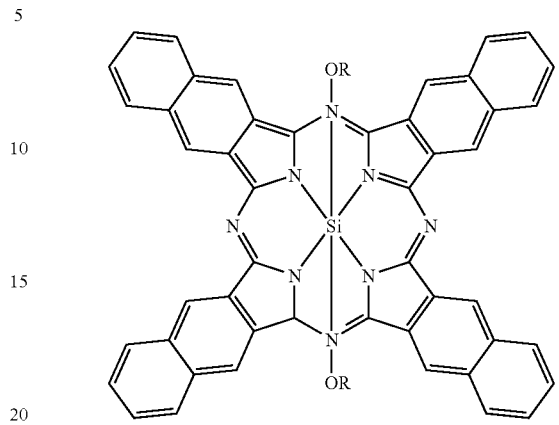 |
R
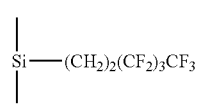
Compound 16
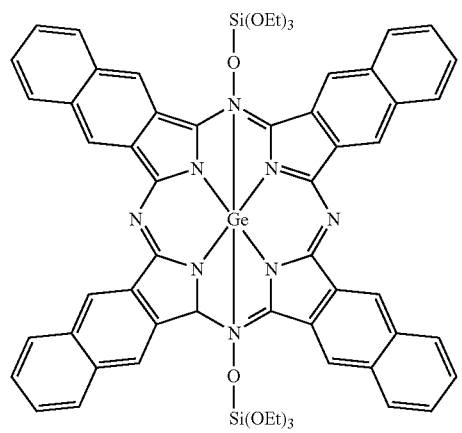
Compound 17
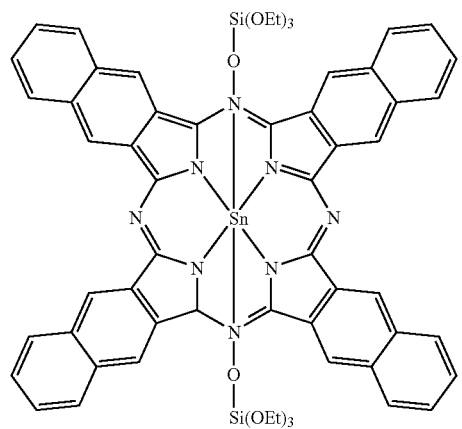
Compound 18
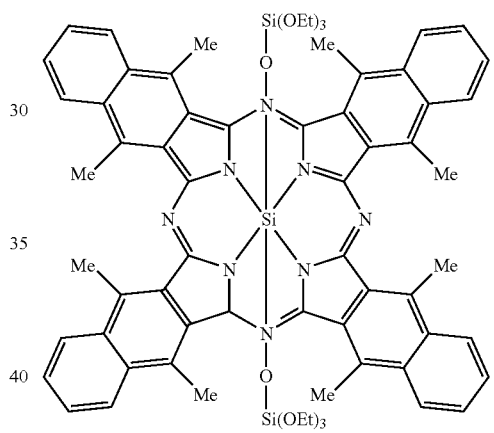
Compound 19
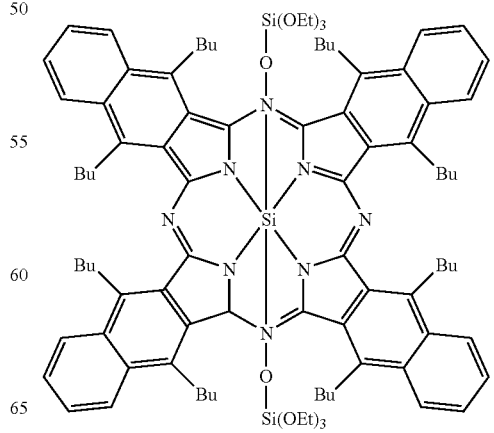

-continued

Compounds 1 to 15

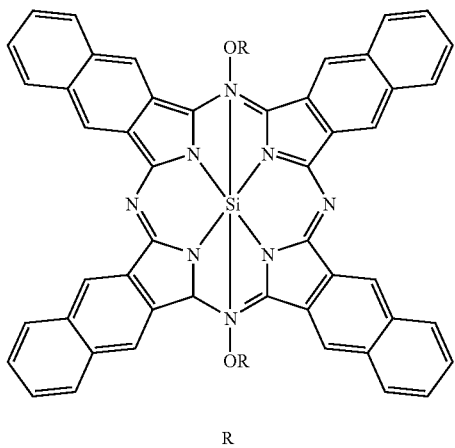

Compound 20

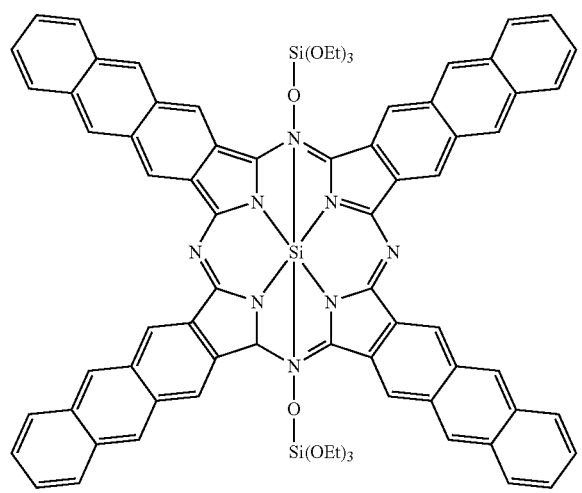

(Synthesis Method)

Naphthalocyanine ring formation reaction for the compounds according to the invention can be carried out in conformance with the methods described in Hirofusa Shirai, Nagao Kobayashi (editors and authors), et al., *Phthalocyanine—Kagaku to Kinou—*, pp. 1-62, Industrial Publishing& Consulting, Inc. (1997), and Ryo Hirohashi, Kei-ichi Sakamoto & Eiko Okumura, *Kinousei Shikiso tositeno Phthalocyanine*, pp. 29-77, Industrial Publishing & Consulting, Inc. (2004).

Examples of a typical method for syntheses of naphthalocyanine derivatives include the Wyler method, the phthalonitrile method, the lithium method, the subphthalocyanine method and the chlorinated phthalocyanine method as described in the books cited above for reference. In the invention, any reaction conditions may be adopted for the naphthalocyanine ring formation reaction. It is preferable that various metals to become the central metals of naphthalocyanines are added during the ring formation reaction, but the desired metals may be introduced after syntheses of central metal-free naphthalocyanine derivatives. As to the reaction solvent, any solvent may be used, but a high boiling solvent is preferably used. For the speeding up of the ring formation reaction, the use of an acid or a base, especially a base, is favorable. The optimum reaction conditions, though vary with the structures of the intended naphthalocyanine derivatives, can be laid down by reference to the concrete reaction conditions described in the books cited above.

As materials for syntheses of the naphthalocyanine derivatives, derivatives of naphthalic acid anhydride, naphthalimide, naphthalic acid and salts thereof, naphthalic acid diamide, naphthlonitrile, 1,3-diiminobenzoisoindoline and so on can be used. These materials may be synthesized by any of known methods.

An organic semiconducting material including the silicon naphthalocyanine derivative according to the invention is described below in more detail.

(Description of Organic Semiconducting Material)

The term "organic semiconducting material" as used in the invention refers to the organic material that exhibits properties of a semiconductor. As in the case of a semiconductor including an inorganic material, there are a p-type (hole-transport) organic semiconductor in which electrical conduction using positive holes as carriers takes place and an n-type (electron-transport) organic semiconductor in which electrical conduction using electrons as carriers takes place. The flowability of carriers in an organic semiconductor is expressed in carrier mobility $\mu$. As to the mobility, the higher the better. More specifically, the mobility of $10^{-7}$ cm$^2$/Vs or above is preferred, and that of $10^{-5}$ cm$^2$/Vs or above is far preferred. The mobility can be determined from characteristics at the time of production of a field-effect transistor (FET) device, or by the time-of-flight (TOF) measurement method.

(Film Formation Method)

For forming the compound according to the invention into film on a substrate, any method may be adopted. The compound according to the invention allows film formation by both a vacuum process and a solution process, and both the processes are suitable for the film formation thereof. Examples of a method for film formation by a vacuum process include physical vapor deposition methods, such as a vacuum evaporation method, a sputtering method, an ion plating method and a molecular beam epitaxy (MBE) method, and chemical vapor deposition (CVD) methods, such as plasma polymerization. Of these methods, the vacuum evaporation method is used to particular advantage. The term "film formation by a solution process" refers to the method in which an organic compound is dissolved in a solvent capable of dissolving the organic compound and film is formed by use of the solution thus obtained. Examples of a method for film formation by the solution process include commonly-used methods, such as a cast method, a blade coating method, a wire-bar coating method, a spray coating method, a dipping (immersion) coating method, a beads coating method, an air-knife coating method, a curtain coating method, an inkjet method, a spin coat method and Langmuir-Blodgett (LB) method. Of these methods, the cast method, the spin coat method and the inkjet method are especially preferred over the others.

(Coating Condition)

In the case of forming film on a substrate by a solution process, a coating solution is prepared by dissolving or dispersing a material to form a layer in an appropriate organic solvent (e.g., a hydrocarbon solvent, such as hexane, octane, decane, toluene, xylene, ethylbenzene, 1-methylnaphthalene or 1,2-dichlorobenzene; a ketone solvent, such as acetone, methyl ethyl ketone, methyl isobutyl ketone or cyclohexanone; a halogenated hydrocarbon solvent, such as dichloromethane, chloroform, tetrachloromethane, dichloroethane, trichloroethane, tetrachloroethane, chlorobenzene, dichlorobenzene or chlorotoluene; an ester solvent, such as ethyl acetate, butyl acetate or amyl acetate; an alcohol solvent, such as methanol, propanol, butanol, pentanol, hexanol, chlorohexanol, methyl cellosolve, ethyl cellosolve or ethylene glycol; an ether solvent, such as dibutyl ether, tetrahydrofuran, dioxaneoranisole; a polar solvent, such as N,N-dimethylformamide, N,N-dimethylacetamide, 1-methyl-2-pyrrolidone, 1-methyl-2-imidazolidinone or dimethyl sulfoxide) and/or water, and the coating solution prepared can be formed into thin film by various coating methods. The concentration of the present compound in such a coating solution is adjusted to a range of preferably 0.1 to 80 mass %, far preferably 0.1 to 10 mass %, and thereby the film can be formed with an arbitrary thickness.

In order that film formation is achieved by a solution process, though it is necessary for a material to dissolve in such a solvent as recited above, mere dissolution is not good enough. In general, even a material to be formed into film by a vacuum process can be dissolved in a solvent to some extent. In the solution process, however, there is a step of forming thin film through the evaporation of solvent after the material dissolved in a solvent is coated. In this step, materials unsuitable for the film formation by a solution process crystallize out because most of them have high crystallinity, and it is difficult to form film of good quality from such materials. The compounds according to the invention are also superior in point of resistance to such crystallization.

It is also possible to use a resin binder in performing film formation. In this case, a material to form a layer and a binder resin are dissolved or dispersed in an appropriate solvent as recited above to prepare a coating solution. The coating solution prepared can be formed into thin film by use of a variety of coating methods. Examples of a binder resin usable therein include insulating polymers, such as polystyrene, polycarbonate, polyarylate, polyester, polyamide, polyimide, polyurethane, polysiloxane, polysulfone, polymethyl methacrylate, polymethyl acrylate, cellulose, polyethylene and polypropylene; copolymers of two or more different monomers chosen from constituent monomers of the polymers recited above; photoconductive polymers, such as polyvinyl carbazole and polysilane; and electrically conductive polymers, such as polythiophene, polypyrrole, polyaniline and polyparaphenylenevinylene. These resin binders may be used alone, or as combinations of two or more thereof. From consideration of thin film's mechanical strength, binder resins having high glass transition temperatures are suitable for use. From consideration of charge-transfer rate in thin film, on the other hand, the binder resins suitable for use are a binder resin of polar group-free structure, a photoconductive polymer and an electrically conductive polymer. From the viewpoint of quality of organic semiconductors, it is better to use no binder resin than to use the binder resins as recited above. Depending on the intended purpose, however, such a resin binder may be used. In this case, there is no limit to the amount of a resin binder used, but the content of the resin binder in the film including the present compound is preferably from 0.1 to 30 mass %.

At the time of film formation, the substrate may be heated or cooled. By changing the substrate temperature, it becomes possible to control film quality and packing conditions of molecules in the film to form. The substrate temperature, though not particularly limited, is preferably between 0° C. and 200° C.

(Description of Electronic Device)

The electronic device to which the invention is applied may be any device, but it is preferably a device incorporating an electronics component having a layered structure of thin films. Examples of an organic electronic device incorporating the electronics component according to the invention include an organic transistor, an organic photoelectric transducer, an organic electroluminescent device, a gas sensor, an organic rectifying device, an organic inverter and an information recording device. The organic photoelectric transducer can be used for application to light sensors (solid-state image pickup devices) on one hand, and it can be used for energy conversion purposes (solar cells) on the other. The suitable uses of the organic electronic device are an organic photoelectric transducer, an organic transistor and an organic electroluminescent device, especially an organic photoelectric transducer and an organic transistor. Representatives of the preferred aspects of these devices are illustrated below in detail with the aid of drawings, but the invention should not be construed as being limited to these aspects.

(Device Structure of Field-Effect Transistor)

FIG. 1 is a cross-sectional diagram showing schematically the structure of an organic field-effect transistor device incorporating the electronics component according to the invention. The transistor shown in FIG. 1 has a multilayer structure as its basic structure. Therein, a substrate 11 (e.g., polyester film, such as polyethylene naphthoate (PEN) or polyethylene terephthalate (PET) film, polyimide film, ceramic, silicon, quartz or glass) is placed as the bottom layer, an electrode 12 is provided on a portion of the top surface of the substrate, and further an insulator layer 13 is provided so as to cover the electrode and come into contact with the substrate in the area other than the electrode area. Furthermore, an organic semiconductor layer 14 is provided on the top surface of the insulator layer 13, and two electrodes 15a and 15b are placed in isolation from each other on portions of the top surface of the organic semiconductor layer, respectively. As constituent materials of the electrode 12, the electrode 15a and the electrode 15b, known conductive materials including metals, such as Cr, Al, Ta, Mo, Nb, Cu, Ag, Au, Pt, Pd, In, Ni and Nd, alloys of these metals, carbon materials and conductive polymers can be used without particular restrictions. Incidentally, the structure of FIG. 1 is referred to as a top-contact device. Alternatively, a bottom-contact device which has electrodes 15a and 15b on the bottom side of the organic semiconductor layer can also be used adequately.

The gate width (channel width) W and the gate length (channel length) L each have no particular limits. However, the W/L ratio is preferably at least 10, far preferably at least 20.

The thickness of each layer has no particular limits. However, when a thinner transistor is required, it is appropriate that the total thickness of the transistor be adjusted to a range of 0.1 to 0.5 µm, the thickness of each layer to a range of 10 to 400 nm, and the thickness of each electrode to a range of 10 to 50 nm.

The material forming the insulating layer has no particular restriction so long as it can produce insulating effect, and examples thereof include silicon dioxide, silicon nitride, a polyester insulator, a polycarbonate insulator, an acrylic polymer insulator, an epoxy resin insulator, a polyimide insulator and a polyparaxylylene resin insulator. The top side of the insulating layer 13 may undergo surface treatment. For example, the silicon dioxide insulator layer whose surface is treated by coating with hexamethyldisilazane (HMDS) or octadecyltrichlorosilane (OTS) can be used advantage.

(Sealing)

In order to screen the device from air and moisture and enhance the storage stability of the device, the device in its entirety may be sealed with a sealing metal can, an inorganic material such as glass or silicon nitride, or a high molecular material such as parylene.

Figure 2:
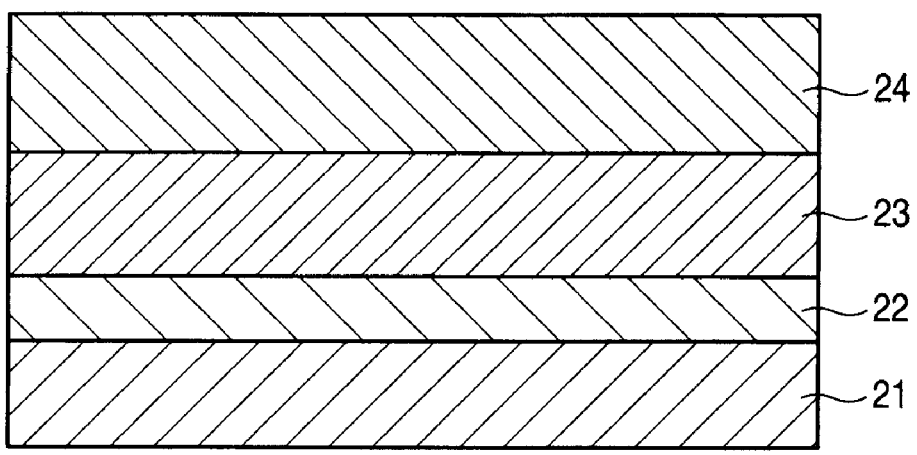
FIG. 2 is a cross-sectional diagram schematically showing the structure of an organic photoelectric transducer according to the invention.

FIG. 2 is a cross-sectional diagram showing schematically the structure of an organic photoelectric transducer incorporating the electronics component according to the invention. The device of FIG. 2 has a multilayer structure. Therein, a substrate 21 (e.g., polyester film, such as polyethylene naphthoate (PEN) or polyethylene terephthalate (PET) film, polyimide film, ceramic, silicon, quartz or glass) is placed as the bottom layer, an electrode layer 22 is provided on the top side of the substrate, a layer 23 including a p-type organic semiconductor and/or an n-type organic semiconductor is further provided as an upper layer of the electrode layer, and further thereon an electrode layer 24 is furthermore provided. Between each of the electrode layers 22 and 24 and the layer 23 including a p-type organic semiconductor and/or an n-type organic semiconductor, an intermediate layer, such as a buffer layer for enhancing surface smoothness, a carrier injection layer for promoting the injection of holes or electrons from the electrode, a carrier block layer for blocking holes or electrons, or a layer having two or more of these functions in combination, may be provided. In such intermediate layers, any materials may be used. As hole-transport organic materials, for example, electrically conductive polymers including polythiophene, triarylamine derivatives and thiophene derivatives can be preferably used. As to electron-transport materials which can be used to advantage, organic ones thereof include aluminum-quinoline complexes, thiazole derivatives, oxazole derivatives, oxadiazole derivatives, triazole derivatives, silole derivatives, naphthalene tetracarboxylic acid derivatives, perylene tetracarboxylic acid derivatives and the like, and inorganic ones thereof include inorganic dielectric materials such as lithium fluoride, metal oxides such as lithium oxide, and so on.

As to materials usable for the electrode layer 22, there is no particular restriction so long as they are pervious to visible or infrared light and show conductivity. The visible or infrared transmittance of the material used is preferably at least 60%, far preferably at least 80%, particularly preferably at least 90%. Suitable examples of such a material include transparent conductive oxides, such as ITO, IZO, $SnO_2$, ATO (antimony-doped tin oxide), ZnO, AZO (Al-doped zinc oxide), GZO (gallium-doped zinc oxide), $TiO_2$ and FTO (fluorine-doped tin oxide). Of these oxides, ITO and IZO are especially preferred from the viewpoints of process suitability and smoothness As to materials usable for the electrode layer 24, there is no particular restriction so long as they show conductivity. From the viewpoint of enhancing the light utilization efficiency, highly reflective materials are preferably used. Of such materials, Al, Pt, W, Au, Ag, Ta, Cu, Cr, Mo, Ti, Ni, Pd and Zn are especially preferred.
(Film Thickness)

The film thickness of the organic semiconductor layer has no particular limitations by the kind of the electronic device in which it is incorporated, but it is preferably from 5 nm to 50 μm, far preferably from 20 nm to 500 nm.
(Sealing)

For enhancement of the storage stability of the device, it is appropriate that the device in its entirety be sealed with a sealing metal can, an inorganic material such as glass or silicon nitride, or a high molecular material such as parylene, thereby screening the device from air and moisture.

When the photoelectric transducer is used as a solar cell for energy conversion purpose, in order to achieve efficient absorption of sunlight and enhance the energy conversion efficiency, it is advantageous to use therein a material capable of absorbing light of wavelengths extending to a longer wavelength region beyond 600 nm, preferably a near infrared wavelength region beyond 700 nm, and converting the absorbed light to electricity. On the other hand, when the photoelectric transducer is used as an infrared photoelectric conversion material for solid-state image pickup device, it is advantageous to use therein a material having a great difference between the current value during unirradiated conditions (dark current) and the current value during irradiated conditions (photocurrent) (a great S/N ratio) The compounds according to the invention have advantages in that they have absorption of light with wavelengths extending to a long wavelength region of 800 nm or more and allow photoelectric conversion at a high S/N ratio.

When the photoelectric transducer is used for application to solid-state image pickup devices, a bias voltage is placed between the electrode layer 22 and the electrode layer 24. The polarity of this bias voltage is set so that electrons of the electric charges generated in the photoelectric conversion film 23 move to one electrode and positive holes of them move to the other electrode. The bias voltage is preferably chosen so that the value obtained by dividing the bias voltage by the distance between the lower electrode and the upper electrode falls within the range of $1.0\times10^4$ V/cm to $1.0\times10^7$ V/cm, preferably the range of $1.0\times10^4$ V/cm to $1.0\times10^6$ V/cm. By application of the bias voltage in such a range, electric charges can be transferred to electrodes with efficiency and signals responsive to these electric charges can be taken out to the outside.

EXAMPLES

The invention will now be illustrated in more detail by reference to the following examples, but these examples should not be construed as limiting the scope of the invention.

Synthesis Example

Synthesis of Compound 2

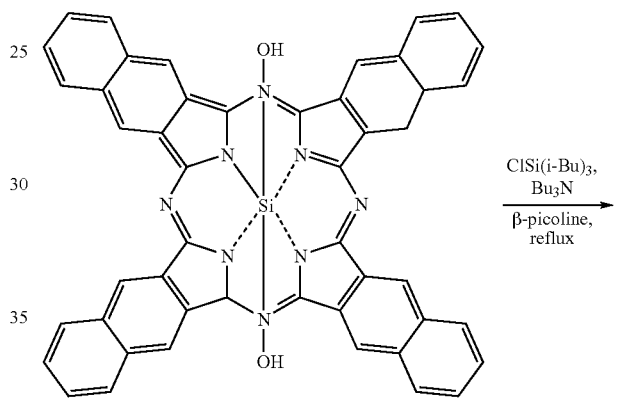

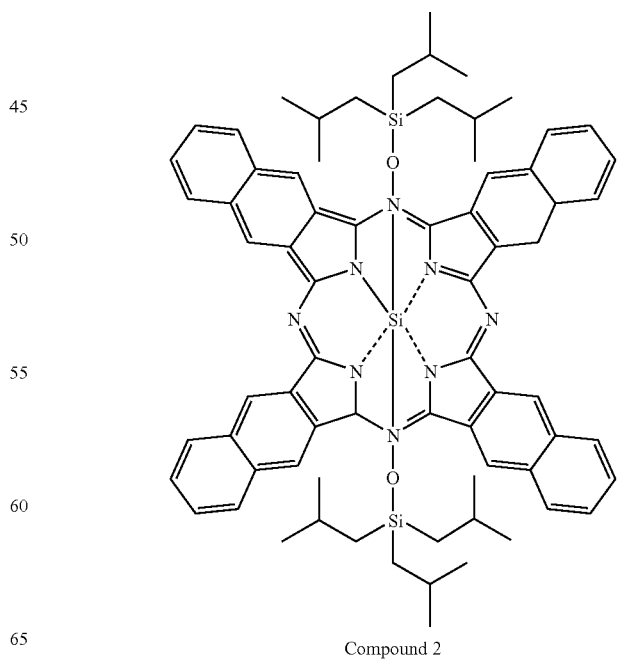

Compound 2

Silicon dihydroxynaphthalocyanine (1.0 g, 1.29 mmol), chlorotributylsilane (4.4 mL), tributylamine (4.0 mL) and β-picoline (140 mL) were mixed, and heated under reflux for 2 hours under a nitrogen atmosphere. The resulting reaction solution was cooled to room temperature, and poured into a solvent mixture of water (100 mL) and ethanol (100 mL), whereupon a green powder separated out. The green powder was thoroughly washed with ethanol, the starting-point component thereof was removed by column chromatography (NH silica, developing solvent toluene), and then the thus isolated product was recrystallized from toluene. Thus, Compound 2 was obtained as green crystals having a metallic luster (0.82 g, 54% yield). By HPLC measurement, the purity of Compound 2 was ascertained to be 99% or higher.

$^1$H NMR (CDCL$_3$, 400 MHz) δ=10.12 (s, 8H), 8.68 (dd, 8H), 7.93 (dd, 8H), −0.40 (d, 36H), −0.49 to −0.60 (m, 6H), −2.00 ppm (d, 12H).

<Syntheses of Other Compounds>

Each of Compound 1, Compound 3, Compound 4, Compound 5, Compound 6, Compound 8, Compound 9, Compound 10, Compound 11, Compound 12, Compound 13 and Compound 14 was synthesized in conformance with the synthesis method of Compound 2. $^1$H NMR measurement results of these compounds are shown below.

(Compound 1)
$^1$H NMR (CDCL$_3$, 400 MHz) δ=10.12 (s, 8H), 8.68 (dd, 8H), 7.94 (dd, 8H), −0.90 (d, 36H), −1.60 to −1.70 ppm (q, 6H).

(Compound 3)
$^1$H NMR (CDCL$_3$, 400 MHz) δ=9.92 (s, 8H), 8.68 (dd, 8H), 7.96 (dd, 8H), 6.59 (dd, 6H), 6.24 (dd, 12H), 5.13 ppm (d, 12H).

(Compound 4)
$^1$H NMR (CDCL$_3$, 400 MHz) δ=10.12 (s, 8H), 8.67 (dd, 8H), 7.94 (dd, 8H), 1.60 (q, 12H), −0.19 ppm (t, 18H).

(Compound 5)
$^1$H NMR (CDCL$_3$, 400 MHz) δ=10.12 (s, 8H), 8.67 (dd, 8H), 7.94 (dd, 8H), −0.22 ppm (s, 54H).

(Compound 6)
$^1$H NMR (CDCL$_3$, 400 MHz) δ=10.12 (s, 8H), 8.67 (dd, 8H), 7.94 (dd, 8H), 1.72 to 1.50 (m, 6H), 0.60 to 0.42 (m, 6H), 0.20 to 0.11 (m, 12H), 0.11 to −0.08 (m, 36H), −0.38 to −0.49 ppm (m, 18H).

(Compound 8)
$^1$H NMR (CDCL$_3$, 400 MHz) δ=10.12 (s, 8H), 8.68 (dd, 8H), 7.94 (dd, 8H), −0.91 (s, 18H), −1.82 ppm (s, 12H).

(Compound 9)
$^1$H NMR (CDCL$_3$, 400 MHz) δ=10.14 (s, 8H), 8.69 (dd, 8H), 7.94 (dd, 8H), −0.59 to −0.69 (q, 2H), −0.84 (d, 12H), −1.22 (s, 12H), −2.58 ppm (s, 12H).

(Compound 10)
$^1$H NMR (CDCL$_3$, 400 MHz) δ=10.12 (s, 8H), 8.67 (dd, 8H), 7.93 (dd, 8H), 1.10 to 0.97 (m, 4H), 0.86 to 0.70 (m, 10H), 0.69 to 0.57 (m, 4H), 0.32 to 0.09 (m, 8H), −0.64 to −0.79 (m, 4H), −0.95 to −1.11 (m, 24H), −1.59 to −1.74 (m, 4H), −2.09 to −2.21 ppm (m, 4H).

(Compound 11)
$^1$H NMR (CDCL$_3$, 400 MHz) δ=10.13 (s, 8H), 8.68 (dd, 8H), 7.94 (dd, 8H), 0.90 to 0.80 (m, 2H), 0.60 to 0.49 (m, 4H), 0.10 to −0.12 (m, 8H), −0.53 to 0.63 (m, 2H), −1.31 to −1.50 (m, 4H), −1.80 to −1.95 (m, 2H), −2.59 ppm (s, 12H).

(Compound 12)
$^1$H NMR (CDCL$_3$, 400 MHz) δ=10.07 (s, 8H), 8.62 (dd, 8H), 7.95 (dd, 8H), 6.59 (dd, 6H), 6.24 (dd, 12H), 5.13 (d, 12H), −2.22 ppm (s, 12H).

(Compound 13)
$^1$H NMR (CDCL$_3$, 400 MHz) δ=10.07 (s, 8H), 8.62 (dd, 8H), 7.95 (dd, 8H), −2.00 ppm (s, 12H).

(Compound 14)
$^1$H NMR (CDCL$_3$, 400 MHz) δ=10.12 (s, 8H), 8.68 (dd, 8H), 7.94 (dd, 8H), 0.92 (t, 4H), −0.58 to −0.72 (m, 4H), −1.68 to −1.80 (m, 4H), −2.47 ppm (s, 12H).

The syntheses of Compound 8, Compound 9, Compound 10, Compound 11 and so on yielded the dimer illustrated below as a by-product. In $^1$H NMR spectra (CDCl3, 400 MHz) of these synthesis products, signals originating from the dimer were detected at the positions of δ=9.4(s), 9.0(dd) and 8.3(dd). However, such a by-product was removable by sublimation refining or a like method.

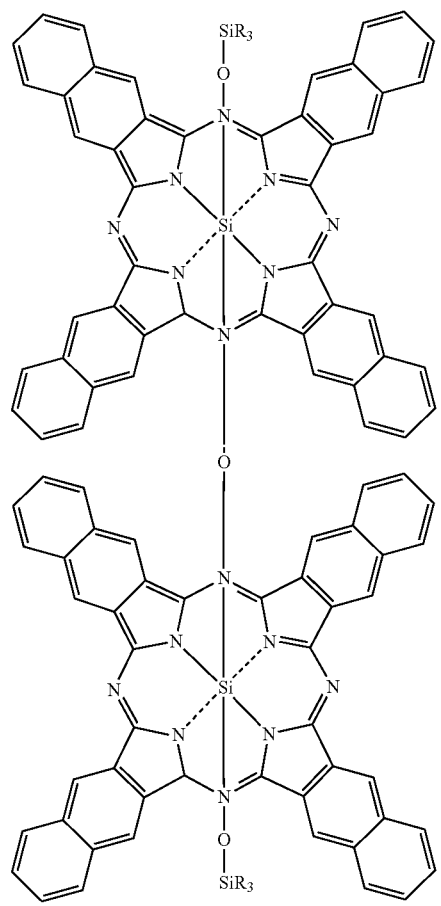

Example 1

A chloroform solution (ranging in concentration from $1 \times 10^{-6}$ to $3 \times 10^{-6}$ mol/L) was prepared using each of the present Compounds 1, 2, 3, 4, 10 and 11 and the comparative Compound 1 (bistrihexylsiloxysilicon naphthalocyanine, purchased from Aldrich and purified by sublimation), and absorption spectrum measurement was made thereon. In addition, solid film of each of those compounds was formed by vacuum evaporation (degree of vacuum: $4 \times 10^{-4}$ Pa or below), and absorption spectrum and ionization potential Ip measurements were made thereon. Further, electron affinity Ea (eV) was determined from an energy gap Eg (eV) estimated from the long wavelength end of each solid film's absorption and the Ip by use of the relation Ea=Ip+Eg. The absorption spectra were measured with an ultraviolet-visible spectrometer (MPC-2200/UV-2400, made by Shimadzu Corporation). The Ip measurements were made with an instrument for photoelectron spectroscopy in air, RIKEN KEIKI AC-2, made by Riken Keiki Co., Ltd.

By these experiments, it was found that all of the present Compounds had solution process suitability because of their high solubility, and besides, their vacuum evaporation capabilities were also satisfactory. The maximum absorption wavelength λmax of each of the solutions and the solid films, the shift width of λmax (in energy terms), and the ionization potential Ip and electron affinity Ea of each of the solid films are shown in Table 1.

It can be seen from Table 1 that, since all the solid films formed from the present Compounds showed their absorption at longer wavelengths than the solid film formed from the comparative Compound 1, the present Compounds can be utilized as infrared dyes showing absorption at longer wavelengths than the comparative Compound 1. In addition, all the present Compounds in a solid film state were greater in shift width of the maximum absorption wavelength than the comparative Compound 1 in a solid film state, and this result proves that the present Compounds each have greater intermolecular interaction in the solid film.

TABLE 1

| Compound | Solution λmax (nm) | Solid Film λmax (nm) | Shift Width (eV) | Ip (eV) | Ea (eV) |
|---|---|---|---|---|---|
| Compound 1 | 773 | 818 | 0.088 | 5.3 | 3.9 |
| Compound 2 | 772 | 808 | 0.068 | 5.3 | 3.8 |
| Compound 3 | 782 | 818 | 0.070 | 5.1 | 3.7 |
| Compound 4 | 779 | 825 | 0.089 | 4.9 | 3.5 |
| Compound 10 | 773 | 809 | 0.071 | 5.5 | 4.0 |
| Compound 11 | 772 | 817 | 0.088 | 5.2 | 3.8 |
| Comparative Compound 1 | 772 | 805 | 0.066 | 5.3 | 3.8 |

Example 2

Figure 3:
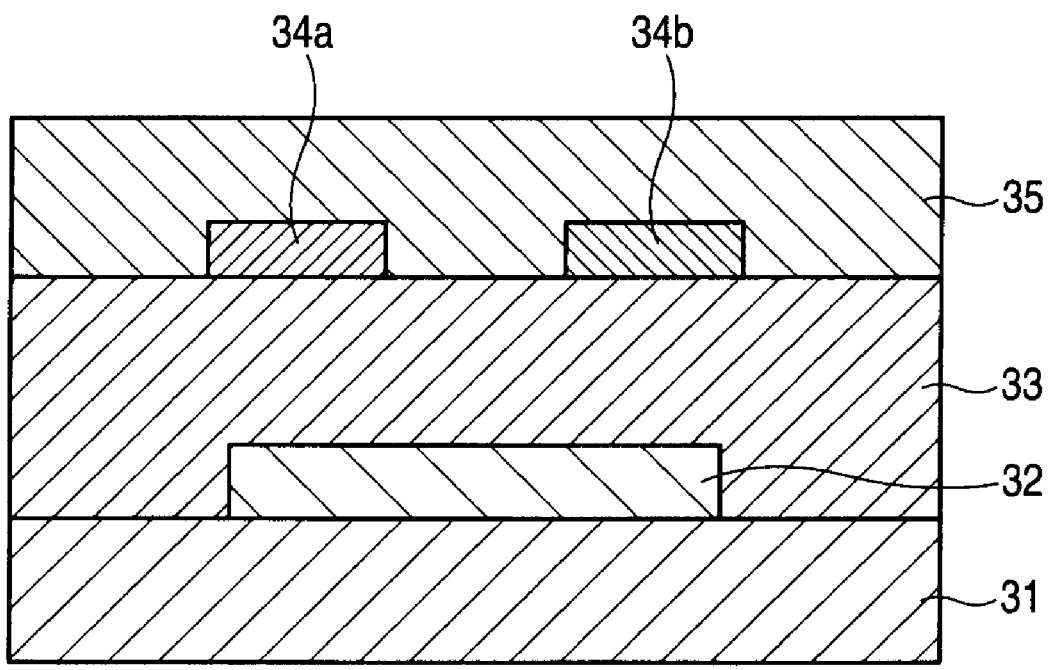
FIG. 3 is a diagram showing the substrate used for FET characteristic measurements in the invention.
Figure 4A:
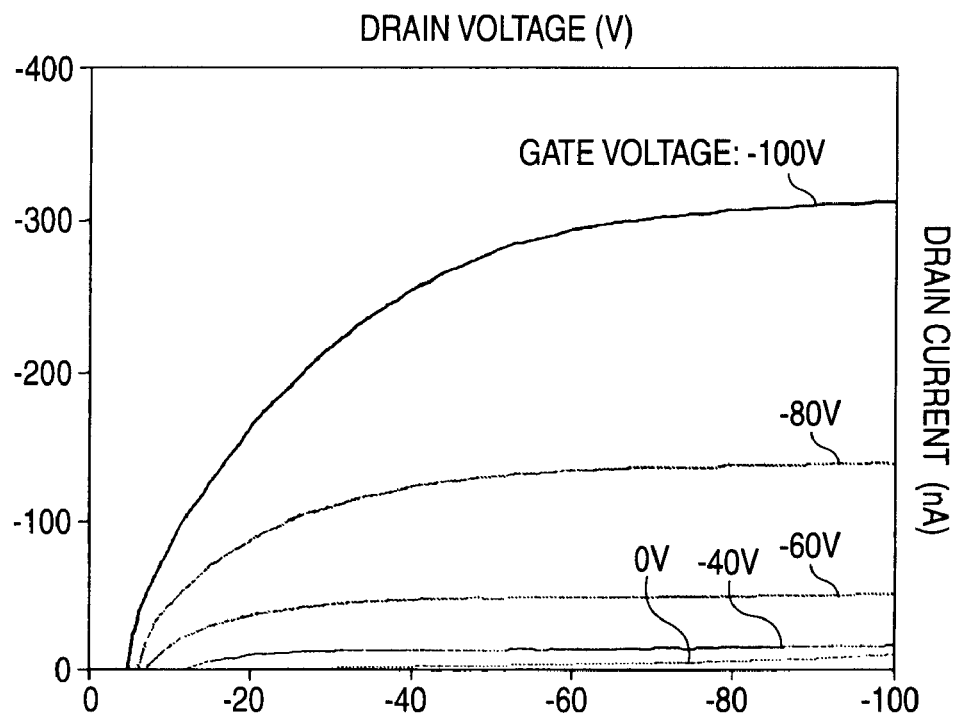
Figure 4B:
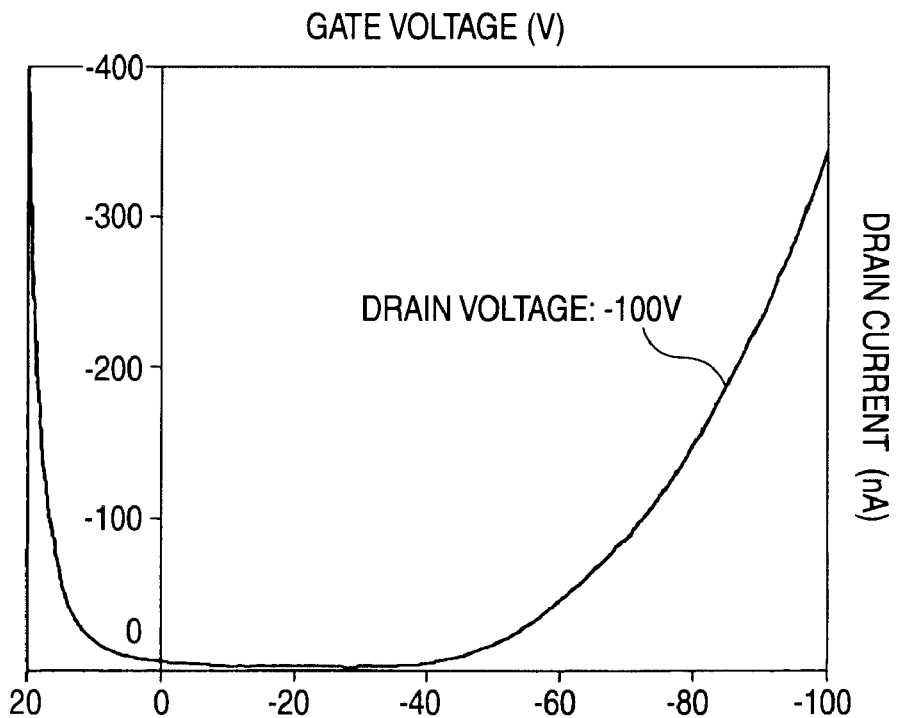

Each of Compounds 1, 2 and 4 according to the invention, Comparative Compound 1 described in Example 1 (bistrihexylsiloxysilicon naphthalocyanine, purchased from Aldrich and purified by sublimation) and Comparative Compound 2 (bistriethylsiloxysilicon naphthalocyanine, synthesized according to the already cited references and purified by sublimation) in an amount of 1 mg was dissolved in 1 mL of 1,2-dichlorobenzene. Each of the resulting solutions was cast-coated on a substrate for FET characteristic measurements, which was heated to 120° C., thereby forming an FET characteristic measuring sample having a uniform thickness of 1 μm or below (but Comparative Compound 2 failed to form a uniform film because of its low solubility in the solvent). As the substrate for FET characteristic measurements, the substrate shown in FIG. 3 was used. More specifically, the substrate used was a silicon substrate of bottom contact structure equipped with chromium/gold source and drain electrodes (gate width W=100,000 μm; gate length L=100 μm) in comb configurations and SiO$_2$ (film thickness: 200 nm) as the insulating film. The FET characteristics were measured under a nitrogen atmosphere of normal pressure (in a glove box) by means of a semiconductor parameter analyzer (4156C, made by Agilent) to which Semiauto Prover AX-2000 (made by Vector Semiconductor Co., Ltd.) was connected. In these examinations of FET characteristics, Compounds 1, 2 and 4 according to the invention exhibited excellent p-type semiconductor characteristics (see FIGS. 4A and 4B and Table 2). In Table 2 are shown the values of carrier mobility μ (merely expressed as "mobility" in the table) calculated from the drain current Id given by the expression Id=(w/2L)μCi(Vg−Vth)$^2$ (wherein L is a gate length, W is a gate width, Ci is the capacity of an insulating layer per unit area, Vg is a gate voltage, and Vth is a threshold voltage). In contrast to the compounds according to the invention, Comparative Compounds 1 and 2 showed no FET characteristics at all.

TABLE 2

| Compound | Characteristic | Mobility (cm$^2$/Vs) |
|---|---|---|
| Compound 1 | p-type | $1.0 \times 10^{-5}$ |
| Compound 2 | p-type | $3.4 \times 10^{-6}$ |
| Compound 4 | p-type | $1.2 \times 10^{-5}$ |
| Comparative Compound 1 | no working | — |
| Comparative Compound 2 | no working | — |

Example 3

A 100-nm layer of the following triarylamine compound A serving both as a buffer layer and an electron blocking material, a 25-nm layer of the compound according to the invention (Compound 2, 3, 5 or 10) or the comparative compound (Comparative Compound 1 or 2) as a photoelectric conversion material and a 50-nm layer of the following Alq as a hole blocking material were vacuum-evaporated onto an ITO substrate in the order of mention, further thereon a 5-nm film of ITO was formed as an upper electrode by a sputtering method, and finally the thus formed multilayer film was sealed with a metallic sealing tube in an atmosphere of nitrogen, thereby making a photoelectric transducer. The thickness of each layer was ascertained by means of a quartz oscillator. Measurements of photoelectric conversion characteristics were made by using spectral sensitivity measuring apparatus (made by Sumitomo Heavy Industries Mechatronics, Ltd.) equipped with a source meter (6430, Keithley Instruments Inc.) as the photoelectric transducer was irradiated with white light (0.05 mW/cm$^2$) from an xenon lamp as light source (L2195, made by Hamamatsu Photonics K.K.) in an irradiation range 1.5 mm in diameter. Values of the external quantum efficiency max (%) (the value at λmax) at the time of application of an external voltage providing a dark current value of 3 nA/cm$^2$ are shown in Table 3. As can be seen the results shown in Table 3, all the compounds according to the invention showed photoelectric conversion characteristics higher in S/N ratio than Comparative Compounds 1 and 2.

TABLE 3

Triarylamine Compound A

Alq

| Photoelectric Conversion Material | External Quantum Efficiency max (%) |
|---|---|
| Compound 2 | 12 |
| Compound 3 | 13 |
| Compound 5 | 4 |
| Compound 10 | 19 |
| Comparative Compound 1 | 3 |
| Comparative Compound 2 | 1 |

From the experimental results shown above, it can be seen that the compounds according to the invention have both vacuum process suitability and solution process suitability, exhibit light absorption and photoelectric conversion characteristics in the infrared region and demonstrate excellent carrier transport properties, so they are applicable to various kinds of organic electronic devices.

The present invention provides an organic semiconducting material that can be formed into film by both of a vacuum process and a solution process, has high carrier transportability and shows light absorption and high photoelectric conversion efficiency in the infrared region, and further provides a film and various high-performance electronic devices (especially a photoelectric transducer and an organic transistor) which each include such an organic semiconducting material. In addition, the present organic semiconducting material is outstanding for easiness of high-degree purification, because a wide variety of purification methods including sublimation purification, recrystallization and various types of chromatography can be applied thereto.

The entire disclosure of each and every foreign patent application from which the benefit of foreign priority has been claimed in the present application is incorporated herein by reference, as if fully set forth.

What is claimed is:

1. A naphthalocyanine compound represented by formula (1);

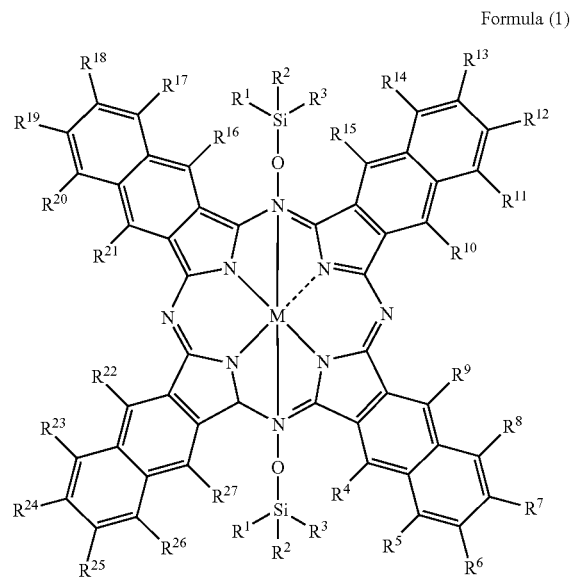

Formula (1)

wherein M represents Si, $R^1$ to $R^3$ each represents an alkyl group having 1 to 30 carbon atoms, an aryl group having 6 to 30 carbon atoms, an alkoxy group having 1 to 30 carbon atoms, an amino group, an alkylamino group having 1 to 30 carbon atoms, or aniline group having 6 to 30 carbon atoms, and may be substituted, and $R^4$ to $R^{27}$ each independently represents a hydrogen atom or a substituent, wherein at least one of $R^1$ to $R^3$ is a branched alkyl group having 3 to 6 carbon atoms, an aromatic hydrocarbon group having 6 to 12 carbon atoms, or an aromatic heterocyclic group having 6 to 12 carbon atoms.

2. The compound according to claim 1, wherein R1 to R3 are selected from at least two different functional groups selected from the group consisting of an alkyl group having 1 to 30 carbon atoms, an aryl group having 6 to 30 carbon atoms, an alkoxy group having 1 to 30 carbon atoms, an amino group, an alkylamino group having 1 to 30 carbon atoms, or aniline group having 6 to 30 carbon atoms, each of which may be substituted.

3. The compound according to claim 1, wherein all of $R^4$ to $R^{27}$ in the formula (1) are hydrogen atoms.

4. An infrared dye composition comprising a naphthalocyanine compound represented by formula (1);

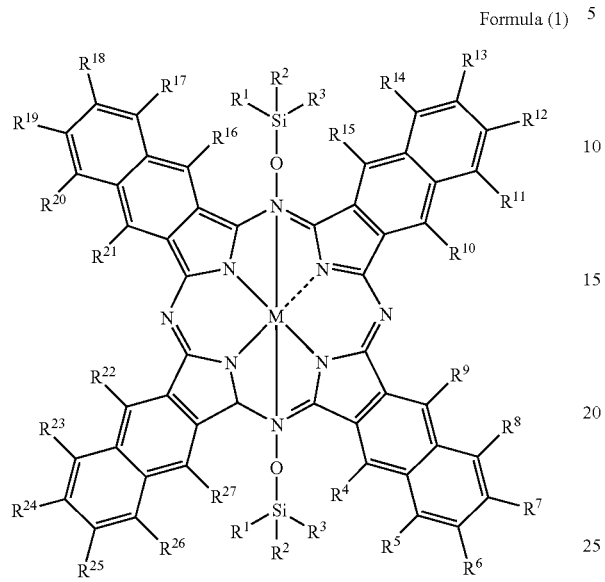

Formula (1)

wherein M represents Si, $R^1$ to $R^3$ each represents an alkyl group having 1 to 30 carbon atoms, an aryl group having 6 to 30 carbon atoms, an alkoxy group having 1 to 30 carbon atoms, an amino group, an alkylamino group having 1 to 30 carbon atoms, or aniline group having 6 to 30 carbon atoms, and may be substituted, and $R^4$ to $R^{27}$ each independently represents a hydrogen atom or a substituent, wherein at least one of $R^1$ to $R^3$ is a branched alkyl group having 3 to 6 carbon atoms, an aromatic hydrocarbon group having 6 to 12 carbon atoms, or an aromatic heterocyclic group having 6 to 12 carbon atoms.

* * * * *